(12) United States Patent
Kang

(10) Patent No.: US 9,343,163 B2
(45) Date of Patent: May 17, 2016

(54) SEMICONDUCTOR MEMORY DEVICE AND OPERATING METHOD BASED UPON A COMPARISON OF PROGRAM DATA AND READ DATA THEREOF

(71) Applicant: SK hynix Inc., Icheon-si Gyeonggi-do (KR)

(72) Inventor: Won Kyung Kang, Seoul (KR)

(73) Assignee: SK HYNIX INC., Icheon-si, Gyeonggi-do (KR)

( * ) Notice: Subject to any disclaimer, the term of this patent is extended or adjusted under 35 U.S.C. 154(b) by 194 days.

(21) Appl. No.: 13/846,599

(22) Filed: Mar. 18, 2013

(65) Prior Publication Data

US 2014/0126285 A1    May 8, 2014

(30) Foreign Application Priority Data

Nov. 5, 2012 (KR) .................. 10-2012-0124234

(51) Int. Cl.
| | |
|---|---|
| *G11C 16/26* | (2006.01) |
| *G11C 11/56* | (2006.01) |
| *G11C 16/10* | (2006.01) |
| *G11C 16/04* | (2006.01) |
| *G11C 16/34* | (2006.01) |

(52) U.S. Cl.
CPC ............ *G11C 16/26* (2013.01); *G11C 11/5628* (2013.01); *G11C 11/5635* (2013.01); *G11C 11/5642* (2013.01); *G11C 16/0483* (2013.01); *G11C 16/10* (2013.01); *G11C 16/349* (2013.01); *G11C 16/3427* (2013.01); *G11C 2216/14* (2013.01)

(58) Field of Classification Search
CPC .... G11C 16/26; G11C 16/10; G11C 16/3418; G11C 16/3422; G11C 16/3431; G11C 16/349
USPC .............. 365/185.2, 185.18, 185.04, 185.09; 711/103
See application file for complete search history.

(56) References Cited

U.S. PATENT DOCUMENTS

| | | | | |
|---|---|---|---|---|
| 8,014,207 | B2 * | 9/2011 | Ryu et al. ................. | 365/185.2 |
| 8,773,922 | B2 * | 7/2014 | Song et al. ............... | 365/189.07 |
| 2008/0259686 | A1 * | 10/2008 | Hwang ............. | G11C 16/3418 365/185.03 |
| 2010/0118608 | A1 * | 5/2010 | Song ................. | G11C 11/5642 365/185.11 |
| 2010/0182830 | A1 * | 7/2010 | Ryu et al. .................. | 365/185.2 |

FOREIGN PATENT DOCUMENTS

| | | | |
|---|---|---|---|
| KR | 102010052159 | A | 5/2010 |
| KR | 1020100085656 | A | 7/2010 |

* cited by examiner

*Primary Examiner* — Alexander Sofocleous
*Assistant Examiner* — Alfredo Bermudez Lozada
(74) *Attorney, Agent, or Firm* — William Park & Associates Ltd.

(57) ABSTRACT

A semiconductor memory device and an operating method of the semiconductor memory device change a read voltage used in a read operation by performing a moving read operation, a randomize operation, and a program/erase compensation operation independently or in combination, thereby stably performing the read operation without an error and reducing a time for the read operation even when distribution of threshold voltages of the memory cells is changed according to a program/erase cycling effect or a retention effect.

13 Claims, 13 Drawing Sheets

SEMICONDUCTOR MEMORY DEVICE AND OPERATING METHOD BASED UPON A COMPARISON OF PROGRAM DATA AND READ DATA THEREOF

CROSS-REFERENCE TO RELATED APPLICATION

This application is based on and claims priority from Korean Patent Application No. 10-2012-0124234, filed on Nov. 5, 2012, with the Korean Intellectual Property Office, the disclosure of which is incorporated herein in its entirety by reference.

BACKGROUND

1. Technical Field

The present invention generally relates to a semiconductor memory device performing a read operation and an operating method thereof.

2. Related Art

FIG. 1 is a graph for describing a change in distribution of threshold voltages of memory cells by cycling and retention effects.

In general, in order to store data in memory cells of a semiconductor memory device, a threshold voltage of the memory cell is increased by performing a program operation. When a high voltage is applied to a control gate in the program operation, electrons flow in a floating gate by FN tunneling to increase the threshold voltage of the memory cell. However, according to the repeat of a program/erase operation in the memory cell, the electrons which have flowed in the floating gate are trapped in a tunnel oxidation layer, and the like. Accordingly, it is known that as the number of program/erase cycling (EW cycling) increases, program speeds of the memory cells increase.

Referring to FIG. 1, it can be seen that as the number of program/erase cycling increases, a right side of an $N^{th}$ distribution becomes gradually widened.

In the meantime, stored data needs to be maintained for a long time (for example, 10 years or more) in a semiconductor memory, especially, a NAND flash memory even in a state where a power is turned off, which is referred to as reliability. According to high-integration of a flash memory, a size of the memory cell is decreased and an interval of each distribution is very narrow. When the distribution is narrow, it is necessary to sensitively adjust the number of electrons stored in the floating gate, and loss of the electrons according to a time needs to be suppressed for reliability. However, as the size of the cell is decreased and the number of electrons stored in one cell is decreased, loss of one electron exerts large influence on the distribution. The electron exhibits negative charge, so that the loss of the electron moves the distribution in a left side.

Referring to FIG. 1, it can be seen that as a time increases, a left side of an N+1th distribution is gradually widened by the retention effect.

Accordingly, there is a problem in that a left cell of a reference distribution (N+1) crosses a right cell of a directly lower distribution (N) of the reference distribution in the distribution. In order to prevent an error generated in a read operation, it is necessary to change a read voltage.

SUMMARY

The present invention has been made in an effort to prevent an error generated in a read operation by optimizing a read voltage used in the read operation.

An embodiment of the present invention provides a method of operating a semiconductor memory device, including: selecting one or more modes among a moving read mode, a randomize mode, and a program/erase compensation mode in response to a mode selection command; performing an operation according to the selected mode, wherein a read voltage is changed according to a difference between data programmed in memory cells and data read from the memory cells when the moving read mode is selected, input data and a random value are randomized to program the input data in the memory cells when the randomize mode is selected, and the read voltage is changed according to the number of program/erase cycling when a program/erase compensation mode is selected.

An embodiment of the present invention provides a semiconductor memory device, including: a memory array including memory cells; a read voltage estimation unit configured to change a second read voltage according to a difference between the number of first reference cells in which least significant bit (LSB) data is programmed by an LSB program operation and the number of first comparison cells in which the LSB data is programmed by performing an LSB read operation based on a second read voltage among first to third read voltages, and change the third read voltage according to a difference between the number of second reference cells in which most significant bit (MSB) data is programmed by an MSB program operation among the first reference cells and the number of second comparison cells in which the MSB data is programmed by performing an MSB read operation based on the third read voltage; and a read voltage supply unit configured to supply the changed read voltage to the memory array in response to a control signal of the read voltage estimation unit.

An embodiment of the present invention provides a semiconductor memory device, including: a memory array including memory cells; a page buffer group configured to program data in the memory cells or read data from the memory cells; a voltage supply circuit configured to supply an operation voltage to the memory array; a random value generation circuit configured to output a random value for randomizing input data to the page buffer group; and a control circuit configured to control the page buffer group and the random value generation circuit in response to a command signal, and control the voltage supply circuit so as to change a read voltage according to a difference between first data programmed in the memory cells and second data read from the memory cells, and change a read voltage according to the number of program/erase cycling.

According to the embodiments of the present invention, the semiconductor memory device and the operating method of the semiconductor memory device change a read voltage used in a read operation by performing a moving read operation, a randomize operation, and a program/erase compensation operation independently or in combination, thereby stably performing the read operation without an error and reducing a time for the read operation even when distribution of threshold voltages of the memory cells is changed according to a program/erase cycling effect or a retention effect.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiments are provided to more sincerely and fully disclose the present invention and to completely transfer the spirit of the present invention to those skilled in the art to which the present invention pertains, and the scope of the present invention should be understood by the claims of the present invention.

Figure 1:
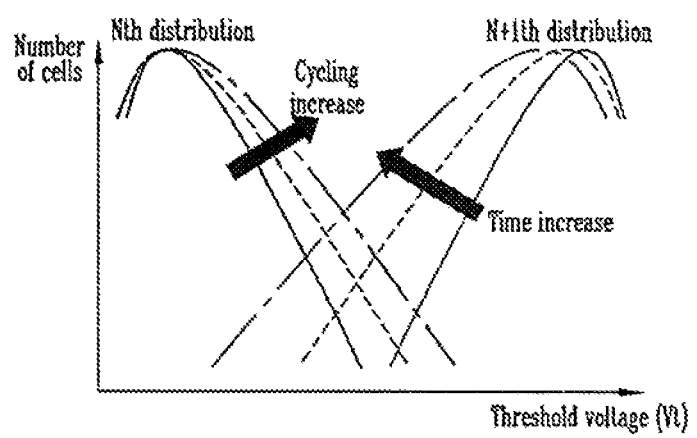
FIG. 1 is a graph for describing a change in distribution of threshold voltages of memory cells by cycling and retention effects.
Figure 2:
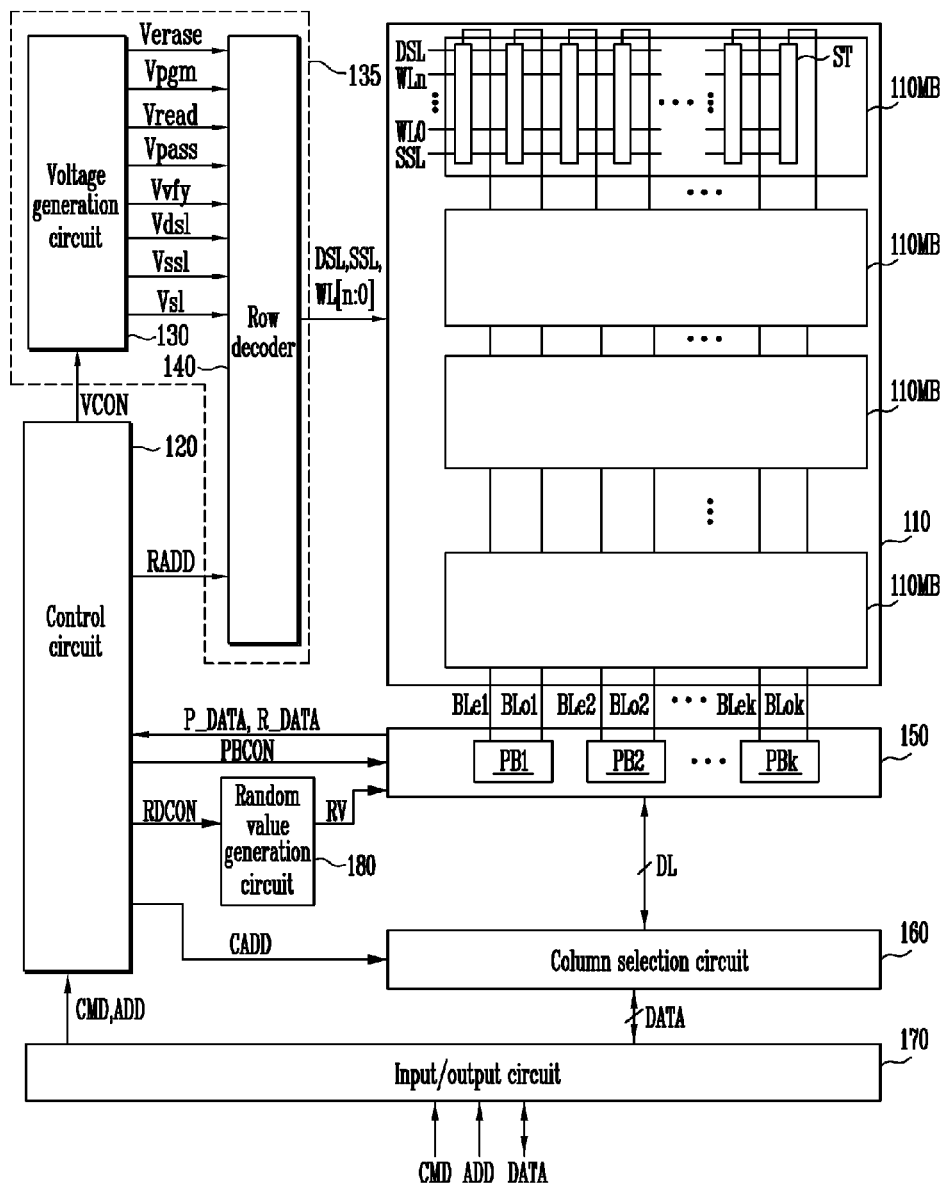
FIG. 2 is a block diagram illustrating a semiconductor memory device according to an embodiment of the present invention.
Figure 3:
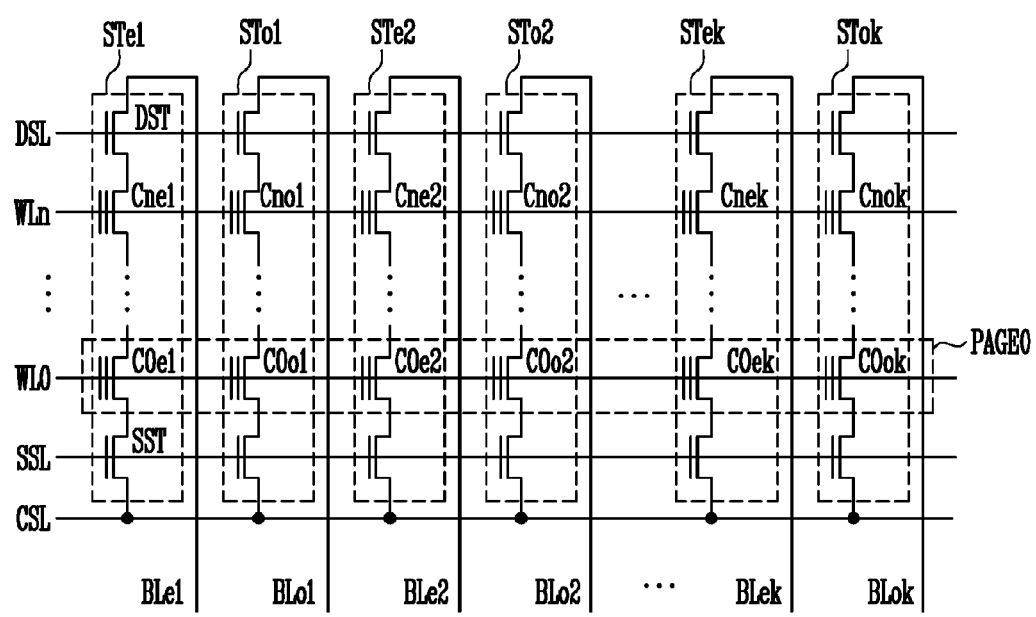
FIG. 3 is a circuit diagram illustrating a memory block illustrated in FIG. 2.

FIG. 2 is a block diagram illustrating a semiconductor memory device according to an embodiment of the present invention. FIG. 3 is a circuit diagram illustrating a memory block illustrated in FIG. 2.

The semiconductor memory device according to the embodiments of the present invention may include a memory array 110 including a plurality of memory blocks 110MB, operation circuits 130, 140, 150, 160, 170, and 180 configured to perform a program operation, a read operation, an erase operation, and a randomize operation of memory cells included in a selected page of the memory block 110MB, and a control circuit 120 configured to control the operation circuits 130, 140, 150, 160, 170, and 180. The operation circuit may include a voltage supply circuit 135, a page buffer group 150, a column selection circuit 160, an input/output circuit 170, and a random value generation circuit 180.

The memory array 110 may include the plurality of memory blocks 110MB.

Referring to FIG. 3, each memory block may include a plurality of strings STe1 to STek and STo1 to STok connected between bit lines BLe1 to BLek, BLo1 to BLok and a common source line CSL. That is, the strings STe1 to STok are connected with the corresponding bit lines BLe1 to BLok, respectively, and are commonly connected with the common source line CSL. Each string Ste1 may include a source select transistor SST in which a source may be connected to the common source line CSL, a plurality of memory cells C0e1 to Cne1, and a drain select transistor DST in which a drain may be connected to a bit line BLe1. The memory cells C0e1 to Cne1 are connected between the select transistors SST and DST in series. A gate of the source select transistor SST may be connected to a source select line SSL, gates of the memory cells C0e1 to Cne1 are connected to word liens WL0 to WLn, respectively, and a gate of the drain select transistor DST may be connected to a drain select line DSL.

The memory cells included in the memory block may be divided in the unit of a physical page or a logical page. For example, the memory cells C0e1 to C0ek, CO01 to C00k connected to one word line (for example, WL0) configures one physical page PAGE0. Further, even numbered cells C0e1 to C0ek connected to one word line (for example, WL0) configure one even physical page, and odd numbered cells CO01 to C00k configure one odd physical page. The page (or the even page and the odd page) serves as a basic unit of a program operation or a read operation. The memory cells included in one page PAGE1 may be divided into main cells and flag cells (or spare cells). The main cells are memory cells for storing general data, and the flag cells (or spare cells) are memory cells for storing information on a state of a memory device, and the like. As an embodiment, information on the number of memory cells having specific data after the performance of the program operation or the read operation may be stored in the flag cells. Otherwise, information on the number of program/erase operations of the memory cells included in a specific memory block may be stored in the flag cells.

Again, referring to FIGS. 2 and 3, the control circuit 120 outputs a voltage control signal VCON for generating a necessary voltage for performing the program operation, a verification operation, the read operation, or the erase operation in response to a command signal CMD input through an input/output circuit 170 from the outside, outputs PB control signals PBCON for controlling page buffers PB1 to PBk included in the page buffer group 150 according to a type of operation, and outputs an RD control signal RDCON for controlling the random value generation circuit 180. An operation of controlling the page buffer group 150 by the control circuit 120 will be described later. Further, the control circuit 120 outputs a row address signal RADD and a column address signal CADD in response to an address signal ADD input from the outside through the input/output circuit 170.

The voltage supply circuit 135 supplies operation voltages (for example, Verase, Vpgm, Vread, Vpass, Vvfy, Vdsl, Vssl, and Vcsl) necessary for the program operation, the read operation, and the erase operation of the memory cells to local lines including the drain select line DSL, the word lines WL0 to WLn, and the source select line SSL of the selected memory block in response to the voltage control signal VCON of the control circuit 120. The voltage supply circuit 135 may include a voltage generation circuit 130 and a row decoder 140.

The voltage generation circuit 130 outputs the operation voltages (for example, Verase, Vpgm, Vread, Vpass, Vvfy, Vdsl, Vssl, and Vcsl) necessary for the program operation, the read operation, or the erase operation of the memory cells to global lines in response to the voltage control signal VCON of the control circuit 120. For example, the voltage generation circuit 130 outputs a program voltage Vpgm to be applied to the memory cells of the selected page and a pass voltage Vpass to be applied to non-selected memory cells to the global lines for the program operation. The voltage generation circuit 130 outputs a read voltage Vread to be applied to the memory cells of the selected page and the pass voltage Vpass to be applied to non-selected memory cells to the global lines for the read operation. The voltage generation circuit 130 outputs an erase voltage Verase to be applied to the memory cells of a selected memory block to the global lines for the erase operation.

The row decoder 140 connects the global lines and the local lines DSL, WL0 to WLn, and SSL so that the operation voltages output from the voltage generation circuit 130 to the global lines may be transmitted to the local lines DSL, WL0 to WLn, and SSL of the memory block 110MB selected in the memory array 110 in response to the row address signals RADD of the control circuit 120. Accordingly, the program voltage Vpgm or the read voltage Vread is applied to the local word lines (for example, WL0) connected with the selected cell (for example, C0W from the voltage generation circuit 130 through the global word line. Further, the pass voltage Vpass is applied to the local word lines (for example, WL1 to WLn) connected with the non-selected cells C1e1 to Cne1 from the voltage generation circuit 130 through the global word lines. In the erase operation, the erase voltage Verase may be applied to the entire memory cells within the memory block. Accordingly, data is stored in the selected cell C0e1 by the program voltage Vpgm, or data stored in the selected cell C0e1 is read by the read voltage Vread.

Each of the page buffer groups 150 may include the plurality of page buffers PB1 to PBk connected with the memory array 110 through the bit lines BLe1 to BLek and BLo1 to BLok. The page buffers PB1 to PBk of the page buffer group 150 selectively precharge the bit lines BLe1 to BLek or BLo1 to BLok according to data input for storing data in the memory cells C0e1 to C0ek or C0o1 to C0ok or sense voltages of the bit lines BLe1 to BLek or BLo1 to BLok for reading data from the memory cells C0e1 to C0ek or C0o1 to C0ok in response to the PB control signal PBCON of the control circuit 120.

For example, when program data (for example, data "0") is input in the page buffer PB1 to be stored in the memory cell C0e1, the page buffer PB1 applies a program allowable voltage (for example, a ground voltage) to the bit line BLe1 of the memory cell C0e1 in which the program data is stored in the program operation. As a result, the threshold voltage of the memory cell C0e1 is increased by the program voltage Vpgm applied to the word line WL0 and the program allowable voltage applied to the bit line BLe1 in the program operation. Then, when erase data (for example, data "1") is input in the page buffer PB1 to be stored in the memory cell C0e1, the page buffer PB1 applies a program inhibition voltage (for example, a power voltage) to the bit line BLe1 of the memory cell C0e1 in which the erase data is stored in the program operation. As a result, the threshold voltage of the memory cell C0e1 is not increased by the program inhibition voltage applied to the bit line BLe1 even when the program voltage Vpgm is applied to the word line WL0 in the program operation. According to the variation of the threshold voltages as described, different data may be stored in the memory cell.

In the meantime, in the read operation, the page buffer group 150 precharges all of the selected bit lines (for example, BLe1 to BLek) and discharges all of the non-selected bit lines (for example, BLo1 to BLok) among the even bit lines BLe1 to BLek and the odd bit lines BLo1 to BLok. Then, the read voltage Vread is applied to the selected word line WL0 from the voltage supply circuit 135, the bit lines of the memory cells in which the program data is stored are maintained in the precharge state, and the bit lines of the memory cells in which the erase data is stored are discharged. The page buffer group 150 senses a change in the voltages of the bit lines BLe1 to BLek and latches the data of the memory cells corresponding to a sensing result.

A detailed configuration of the page buffer will be described later.

The column selection circuit 160 selects the page buffers PB1 to PBk included in the page buffer group 150 in response to the column address signal CADD output from the control circuit 120. That is, the column selection circuit 160 sequentially transmits data to be stored in the memory cells to the page buffers PB1 to PBk in response to the column address signal CADD. Further, the column selection circuit 160 sequentially selects the page buffers PB1 to PBk in response to the column address signal CADD so that the data of the memory cells latched in the page buffers PB1 to PBk by the read operation is output to the outside.

The input/output circuit 170 transmits data to the column selection circuit 160 according to the control of the control circuit 120 in order to input data input from the outside to be stored in the memory cells in the page buffer group 150 in the program operation. When the column selection circuit 160 transmits the data transmitted from the input/output circuit 170 to the page buffers PB1 to PBk of the page buffer group 150 according to the aforementioned method, the page buffers PB1 to PBk store the input data in latch circuits inside therein. Further, the input/output circuit 170 outputs the data transmitted from the page buffers PB1 to PBk of the page buffer group 150 to the output through the column selection circuit 160 in the read operation.

The random value generation circuit 180 generates a random value RV in response to the RD control signal RDCON and outputs the generated random value to the page buffer group 150. Each page buffer of the page buffer group 150 randomizes input data by using the random value.

Figure 4:
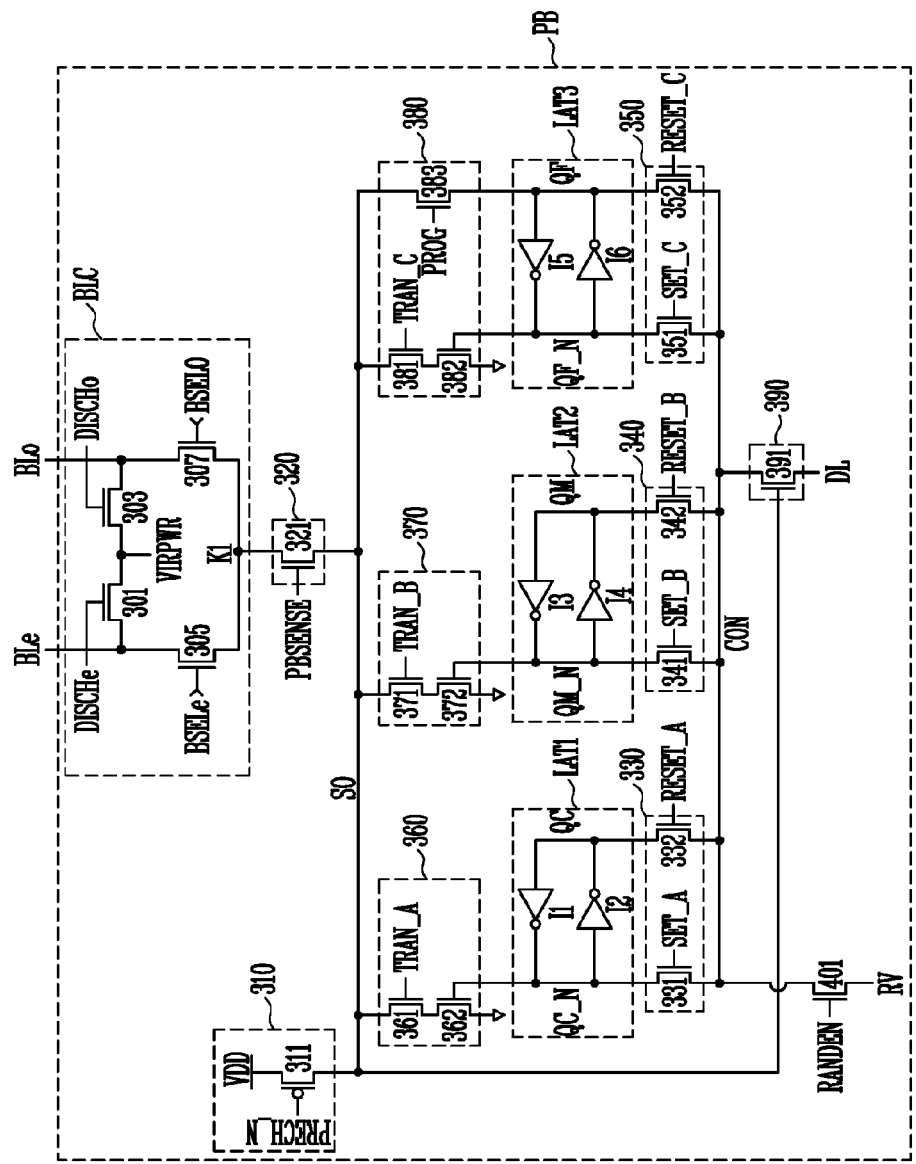
FIG. 4 is a circuit diagram illustrating a page buffer illustrated in FIG. 2.

FIG. 4 is a circuit diagram illustrating a page buffer illustrated in FIG. 2.

Referring to FIG. 4, the page buffer PB is operated according to the control of the control circuit 120 (see FIG. 2), and signals PRECH_N, TRAN, RESET, SET, PBSENSE, PROG, RANDEN, BSELe, BSELo, DISCHe, and DISCHo to be described below may be output from the control circuit.

The page buffer PB may include a bit line connection circuit BLC, a precharge circuit 310, a sensing circuit 320, first to third latches LAT1, LAT2, and LAT3, first to third set/reset circuits 330, 340, and 350, and first to third transmission circuits 360, 370, and 380. Switching elements 305 and 307 of the bit line connection circuit BLC perform an operation of selecting one bit line between the even bit line BLe1 and the odd bit line BLo1 in response to bit line selection signals BSELe and BSELo, and switching elements 301 and 303 perform an operation of precharging the non-selected bit line in the program operation or discharging the non-selected bit line in the read operation in response to discharge signals DISCHe and DISCHo. Each switching element is implemented as an NMOS transistor.

The precharge circuit 310 serves to precharge a sensing node SO by connecting a power voltage terminal VDD and the sensing node SO according to a precharge signal PRECH_N. To this end, the precharge circuit 310 is implemented as a PMOS transistor 311 connected between the power voltage terminal VDD and the sensing node SO to be operated according to the precharge signal PRECH_N.

The sensing circuit 320 connects the selected bit line BL and the sensing node SO according to a sensing signal PBSENSE. To this end, the sensing circuit 320 is implemented as an NMOS transistor 321 connected between the bit line BL and the sensing node to be operated according to the sensing signal PBSENSE.

The first latch LAT1 may include first and second inverters I1 and I2. An input terminal of the first inverter I1 and an output terminal of the second inverter I2 are connected to each other, and an output terminal of the first inverter I1 and an input terminal of the second inverter I2 are connected to each other. The input terminal of the first inverter I1 is referred to as a cache node QC, and the output terminal of the first inverter I1 is referred to as a reverse cache node QC_N.

The second latch LAT2 may include third and fourth inverters I3 and I4. An input terminal of the third inverter I3 and an output terminal of the fourth inverter I4 are connected to each other, and an output terminal of the third inverter I3 and an input terminal of the fourth inverter I4 are connected to each other. The input terminal of the third inverter I3 is referred to as a main node QM, and the output terminal of the third inverter I3 is referred to as a reverse main node QM_N.

The third latch LAT3 may include fifth and sixth inverters I5 and I6. An input terminal of the fifth inverter I5 and an output terminal of the sixth inverter I6 are connected to each other, and an output terminal of the fifth inverter I5 and an input terminal of the sixth inverter I6 are connected to each other. The input terminal of the fifth inverter I5 is referred to as a flag node QF, and the output terminal of the fifth inverter I5 is referred to as a reverse flag node QF_N.

The first set/reset circuit 330 transmits data input in the first latch LAT1 to a common node CON according to a first set signal SET_A and a first reset signal RESET_A. The first set/reset circuit 330 may include an NMOS transistor 331 operated according to the first set signal SET_A to connect the reverse cache node QC_N and the common node CON, and an NMOS transistor 332 operated according to the first reset signal RESET_A to connect the cache node QC and the common node CON.

The second set/reset circuit 340 transmits data input in the second latch LAT2 to the common node CON according to a second set signal SET_B and a second reset signal RESET_B. The second set/reset circuit 340 may include an NMOS transistor 341 operated according to the second set signal SET_B to connect the reverse main node QM_N and the common node CON, and an NMOS transistor 342 operated according to the second reset signal RESET_B to connect the main node QM and the common node CON.

The third set/reset circuit 350 transmits data input in the third latch LAT3 to the common node CON according to a third set signal SET_C and a third reset signal RESET_C. The third set/reset circuit 350 may include an NMOS transistor 351 operated according to the third set signal SET_C to connect the reverse flag node QF_N and the common node CON, and an NMOS transistor 352 operated according to the third reset signal RESET_C to connect the flag node QF and the common node CON.

The first transmission circuit 360 serves to maintain a potential of the sensing node SO or discharge the sensing node SO according to the data stored in the first latch LAT1. The first transmission circuit 360 may include a first switch 361 and a second switch 362 connected to each other in series between the sensing node SO and a ground terminal Vss. The first switch 361 is implemented as an NMOS transistor operated according to a first transmission signal TRAN_A and connecting the sensing node SO and the second switch 362. The second switch 362 is implemented as an NMOS transistor operated according to the data input in the reverse cache node QC_N and connecting the first switch 361 and the ground terminal Vss.

The second transmission circuit 370 serves to maintain a potential of the sensing node SO or discharge the sensing node SO according to the data stored in the second latch LAT2. The second transmission circuit 370 may include a third switch 371 and a fourth switch 372 connected to each other in series between the sensing node SO and the ground terminal Vss. The third switch 371 is implemented as an NMOS transistor operated according to a second transmission signal TRAN_B and connecting the sensing node SO and the fourth switch 372. The fourth switch 372 is implemented as an NMOS transistor operated according to the data input in the reverse main node QM_N and connecting the second switch 371 and the ground terminal Vss.

The third transmission circuit 380 serves to maintain a potential of the sensing node SO or discharge the sensing node SO according to the data stored in the third latch LAT3. The third transmission circuit 380 may include a fifth switch 381 and a sixth switch 382 connected to each other in series between the sensing node SO and the ground terminal Vss, and a seventh switch 383 connected between the sensing node SO and the third latch LAT3. The fifth switch 381 is implemented as an NMOS transistor operated according to a third transmission signal TRAN_C and connecting the sensing node SO and the sixth switch 382. The sixth switch 382 is implemented as an NMOS transistor operated according to the data input in the reverse flag node QF_N and connecting the third switch 381 and the ground terminal Vss. The seventh switch 383 is implemented as an NMOS transistor 383 operated according to an eighth transmission signal PROG and connecting the sensing node SO and the flag node QF.

The discharge circuit 390 serves to discharge the common node CON according to the potential of the sensing node SO. The discharge circuit 390 is operated according to the potential of the sensing node SO, and is implemented as an NMOS transistor 391 connected between the common node CON and the data line DL. The data line DL may be selectively connected to the ground power Vss.

The random switch 401 may be connected between a node in which random data RV output from the random value generation circuit is input and the common node CON, and transmits the random data RV to the page buffer in response to a random signal RANDEN. The random switch 401 is implemented as an NMOS transistor.

Figure 5:
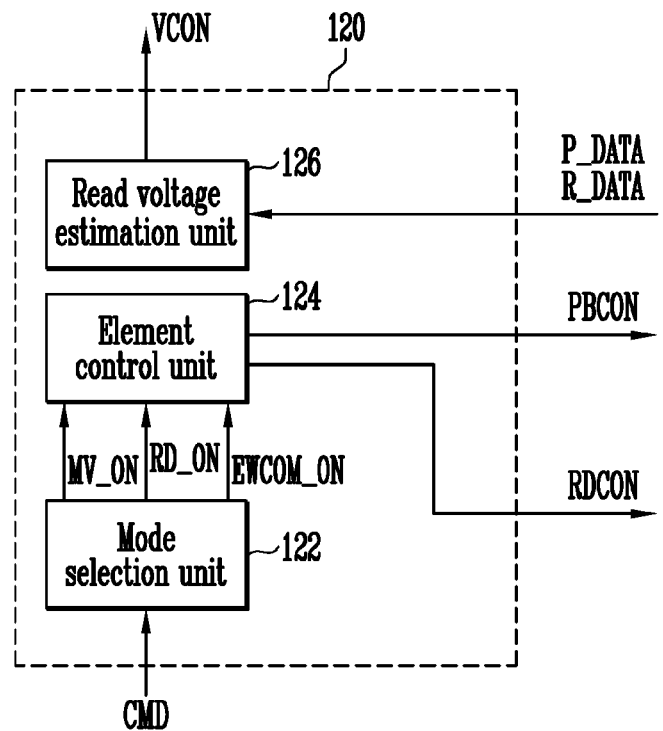
FIG. 5 is a block diagram illustrating a detailed configuration of a control circuit illustrated in FIG. 2.

FIG. 5 is a block diagram illustrating a detailed configuration of the control circuit illustrated in FIG. 2.

Referring to FIG. 2 again, the control circuit 120 outputs the voltage control signal VCON for changing the read voltage according to a difference between data P_DATA programmed in the memory cells by the program operation and data R_DATA read from the memory cells by the read operation. Especially, the control circuit 120 outputs the voltage control signal VCON for changing the read voltage according to the number of program/erase cycling read from the flag cells among the memory cells by the read operation.

Referring to FIG. 5, the control circuit 120 may include a mode selection 122, a element control unit 124, and a read voltage estimation unit 126.

The mode selection unit 122 is configured to output a first selection signal MV_ON for selecting a moving read mode, a second selection signal RD_ON for selecting a randomize mode, and a third selection signal for selecting a program/ erase compensation mode EWCOM_ON in response to the command signal CMD.

The element control unit 124 outputs the PB control signal PBCON for controlling the page buffer group in response to the first to third selection signals MV_ON, RD_ON, and EWCOM_ON, and the FD control signal RDCON for controlling the random value generation circuit in response to the second selection signal RD_ON.

When the moving read mode is selected by the first selection signal MV_ON, the read voltage estimation unit 126 outputs the voltage control signal VCON for changing the read voltage according to a difference between the data P_DATA programmed in the memory cells by the program operation and the data R_DATA read from the memory cells by the read operation, or outputs the voltage control signal VCON for changing the read voltage according to the number of program/erase cycling.

As one embodiment, the data P_DATA programmed in the memory cells by the program operation may include information on the number of first reference cells in which LSB (least significant bit) data is programmed by an LSB program operation and information on the number of second reference cells in which MSB data is programmed by an MSB (most significant bit) program operation among the first reference cells. Further, the data R_DATA read from the memory cells by the read operation may include information on the number of read first comparison cells in which the LSB data is programmed by performing the LSB read operation based on a second read voltage among first to third read voltages in a two bits multi-level cell MLC and information on the number of read second comparison cells in which the MSB data is programmed by performing the MSB read operation based on the third read voltage. The read voltage estimation unit 126 outputs the voltage control signal VCON for changing the second read voltage according to a difference between the number of first reference cells and the number of first comparison cells, and outputs the voltage control signal VCON for changing the third read voltage according to a difference between the number of second reference cells and the number of second comparison cells.

When the program/erase compensation mode is selected by the third selection signal MV_ON, the data R_DATA read from the memory cells by the read operation may include the information on the number of program/erase cycling. When the program/erase compensation mode is selected by the third selection signal MV_ON, the read voltage estimation unit 126 outputs the voltage control signal VCON for re-changing the sizes of the second read voltage and the third read voltage according to the number of program/erase cycling.

As an embodiment, when the randomize mode is selected by the second selection signal RD_ON, the random value generation circuit randomizes input data to first to fourth data. The first to fourth data means data 11, 10, 01, and 00 stored in the two bits multi-level cell, respectively. The page buffer group programs the first to fourth data in the memory cells. The read voltage estimation unit 126 outputs the voltage control signal VCON for changing the second read voltage according to a difference between the number of third or fourth data and the number of read first cells in which the third or fourth data is programmed by performing the read operation based on the second read voltage among the first to third read voltages, and outputs the voltage control signal VCON for changing the third read voltage according to a difference between the number of fourth data and the number of read second cells in which the fourth data is programmed by performing the read operation based on the third read. When the program/erase compensation mode is selected by the third selection signal MV_ON, the read voltage estimation unit 126 outputs the voltage control signal VCON for re-changing the sizes of the second read voltage and the third read voltage according to the number of program/erase cycling.

Figure 6:
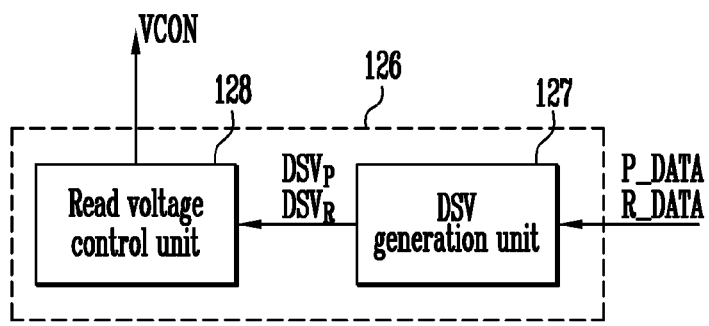
FIG. 6 is a block diagram illustrating a detailed configuration of a read voltage estimation unit illustrated in FIG. 5.

FIG. 6 is a block diagram illustrating a detailed configuration of the read voltage estimation unit illustrated in FIG. 5.

Referring to FIG. 6, the read voltage estimation unit 126 may include a DSV (Digital Sum Value) generation unit 127 and a read voltage control unit 128.

The DSV generation unit 127 calculates first sum data (Digital Sum Value) DSV and outputs the calculated first sum data by counting the number of first reference cells in which the LSB data is programmed by the LSB program operation and the number of second reference cells in which the MSB data is programmed by the MSB program operation among the first reference cells. The DSV generation unit 127 calculates second sum data $DSV_R$ and outputs the calculated second sum data by counting the number of read first comparison cells in which the LSB data is programmed by performing the LSB read operation based on the second read voltage among the first to third read voltages in the two bits multi-level cell MLC and the number of read second comparison cells in which the MSB data is programmed by performing the MSB read operation based on the third read voltage.

When the randomize mode is selected by the second selection signal RD_ON, the DSV generation unit 127 calculates third sum data and outputs the calculated third sum data by counting the number of read first cells in which the third or fourth data is programmed among the first to fourth data stored in the two bits multi-level cell by performing the read operation based on the second read voltage among the first to third read voltages in the two bits multi-level cell and the number of read second cells in which the fourth data is programmed by performing the read operation based on the third read voltage.

The read voltage control unit 128 outputs the voltage control signal VCON for changing the sizes of the second read voltage and the third read voltage according to a difference between the first sum data DSV and the second sum data $DSV_R$. The read voltage control unit 128 may include a table representing a degree for changing the sizes of the second read voltage and the third read voltage according to a difference between the first sum data DSV and the second sum data $DSV_R$.

Hereinafter, an operating method of the semiconductor memory device according to an embodiment of the present invention including the aforementioned configuration will be described.

Figure 7:
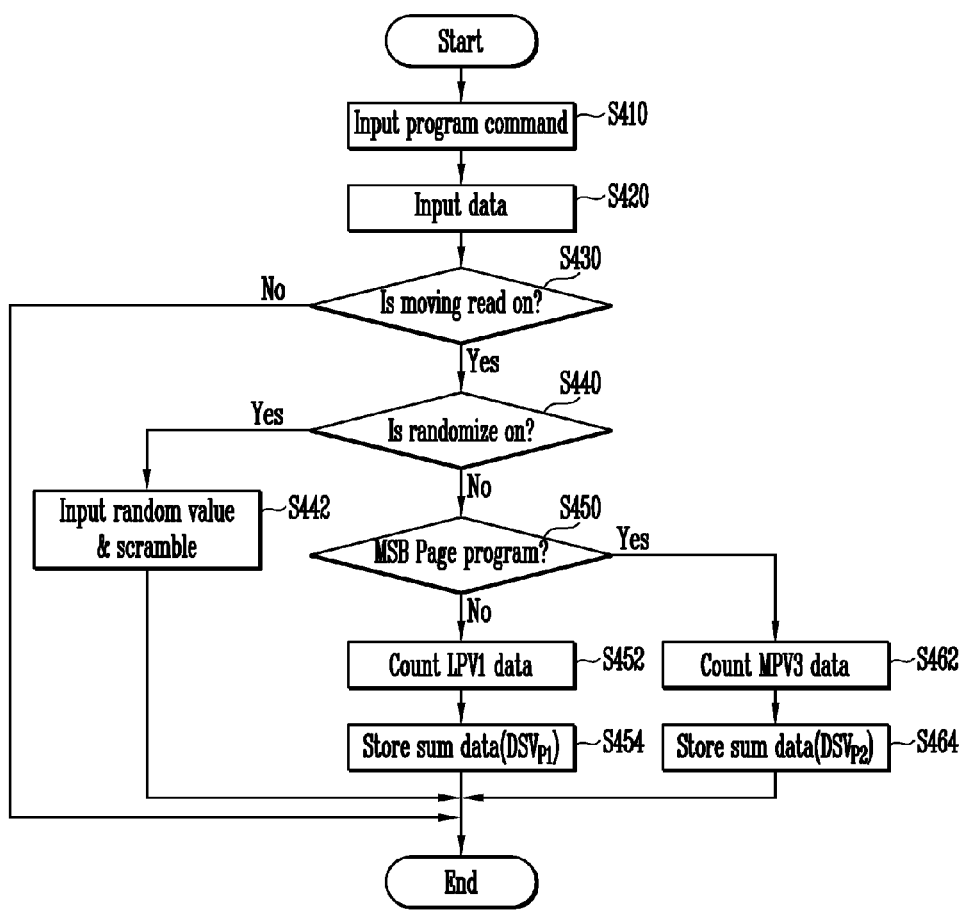
FIG. 7 is a flowchart illustrating a program operation among operations of the semiconductor memory device according to the embodiment of the present invention.

FIG. 7 is a flowchart illustrating the program operation among the operations of the semiconductor memory device according to the embodiments of the present invention.

Referring to FIG. 7, a program command for performing the program operation is input (S410) and then data is input (S420). When the program command is input, a command for selecting a mode is input, and at least one mode among the moving read mode, the randomize mode, or the program/ erase compensation mode is selected in response to a mode selection command signal.

When the moving read mode and the randomize mode are selected (S430 and S440), a random value is input in the page buffer from the random value generation circuit, and the page buffer programs randomized input data in the memory cells by performing a scramble operation for calculating the input data and the random value (S442). When the moving read mode and the randomize mode are selected, it is not necessary to perform the data program operation, which will be described later.

When the moving read mode is selected and the randomize mode is not selected, whether the input data is data by which the MSB page is programmed is identified (S450), which may be identified through flag cell data.

When the MSB page is not programmed, the number of memory cells (including data "0") having a threshold voltage equal to or larger than a first program verification voltage LPV1 is counted (S452). Then, sum data $DSV_{P1}$ is stored (S454).

When the MSB page is programmed, the number of memory cells (including data "01") having a threshold voltage equal to or larger than a third program verification voltage MPV3 is counted in the program verification operation of the two bits multi-level cell (S462). Then, sum data $DSV_{P2}$ is stored (S464). Although it is not illustrated, even when the MSB page is programmed, the number of memory cells (including data "0") having a threshold voltage equal to or larger than the first program verification voltage LPV1 may be counted and the sum data $DSV_{P1}$ may be stored.

Since the randomize mode may be turned on/off in the embodiments of the present invention, when randomized data is input from an external host, it is possible to decrease a time for the randomize operation by turning off the randomize mode.

Figure 8:
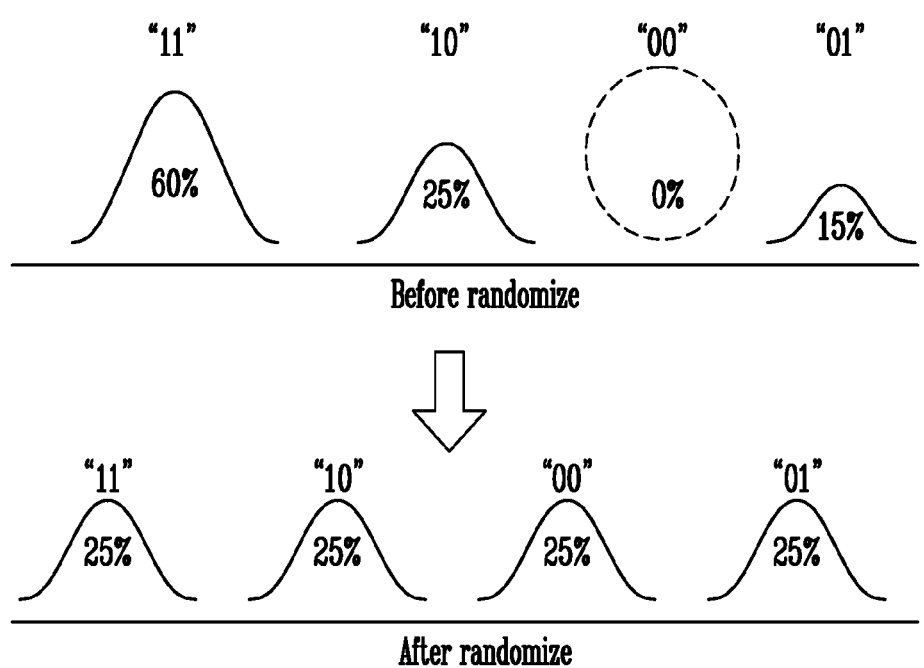
FIG. 8 is a view illustrating a randomize mode illustrated in FIG. 7.

FIG. 8 is a view illustrating the randomize mode illustrated in FIG. 7.

As illustrated in FIG. 7, when the randomize mode is activated, it is not necessary to count the number of memory cells in the program verification operation.

Referring to FIG. 8, it can be seen that the numbers of input data 11, 10, 00, and 01 in the program operation of the two bits multi-level cell occupies 60%, 25%, 0%, and 15%, respectively, before the randomize operation. However, it can be seen that the numbers of data 11, 10, 00, and 01 equally become 25% after the randomize operation. Accordingly, if the total number of input data is recognized, it is possible to recognize the number of each data, so that it is not necessary to count the number of memory cells after the program operation is performed. Accordingly, it is possible to decrease a time for the operation.

Figure 9:
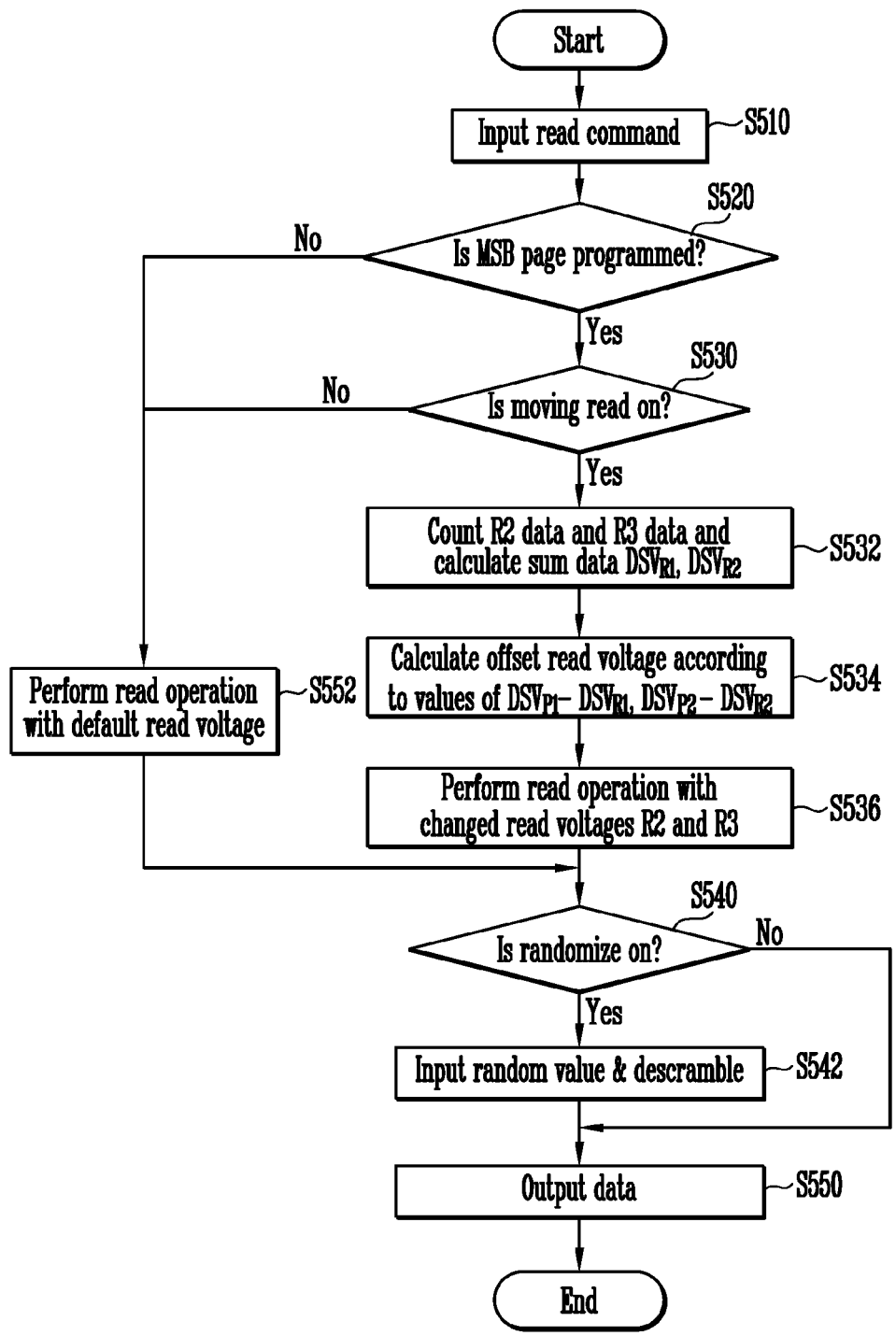
FIG. 9 is a flowchart illustrating a read operation among operations of the semiconductor memory device according to the embodiments of the present invention.

FIG. 9 is a flowchart illustrating the read operation among the operations of the semiconductor memory device according to the embodiments of the present invention.

Referring to FIG. 9, a read command is first input (S510). In this case, a mode selection command for selecting one or more of the moving read mode, the randomize mode, and the program/erase compensation mode is input.

Next, whether the MSB page is programmed is identified (S520). Whether the MSB page is programmed may be identified by referring to flag data.

When the MSB page is not programmed, the read operation is performed with an existing read voltage, that is, a default read voltage (S522). When the MSB page is not programmed, the read voltage may be changed based on the LSB data, but it is not considered in the embodiment of the present invention.

When the MSB page is programmed, whether the moving read is turned on, that is, the moving read mode is selected, is identified (S530).

When the moving read mode is selected, the number of memory cells is counted and sum data DSV is calculated by performing the read operation with the default read voltage. The number of memory cells having a threshold voltage larger than a second read voltage (that is, the memory cells in a third state ("00") and a fourth state ("01") among the two bits multi-level cells) is counted and sum data $DSV_{R1}$ is calculated by performing the read operation with the second read voltage R2. Then, the number of memory cells having a threshold voltage larger than a third read voltage (that is, the memory cells in the fourth state ("01") among the two bits multi-level cells) is counted and sum data $DSV_{R2}$ is calculated by performing the read operation with the third read voltage R3 (S532).

Next, an offset read voltage of the second read voltage R2 is calculated according to a difference between the sum data $DSV_{P1}$ calculated in the program operation of FIG. 7 and the sum data $DSV_{R1}$ calculated in the read operation, and an offset read voltage of the third read voltage R3 is calculated according to a difference between the sum data $DSV_{R2}$ and the sum data $DSV_{P2}$ (S534).

Next, the read operation is performed with the changed second read voltage R2 and third read voltage R3 (S536).

When the moving read mode is not selected in step S530, the process returns to step S522 and the read operation is performed with the default read voltage.

Whether the randomize mode is selected is identified (S540). When the randomize mode is selected, a descramble operation of the random value and the read data is performed by the page buffer group by inputting the random value (S542). Next, the data is output (S544).

Figure 10:
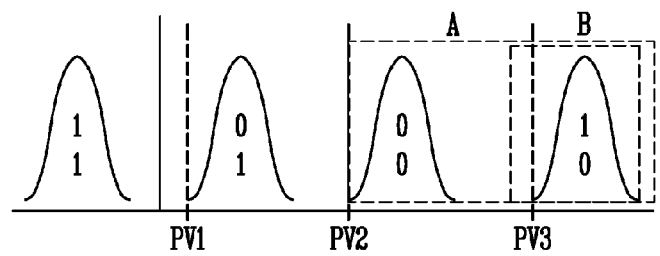
FIGS. 10 to 12 are diagrams illustrating a moving read mode illustrated in FIG. 9.
Figure 11:
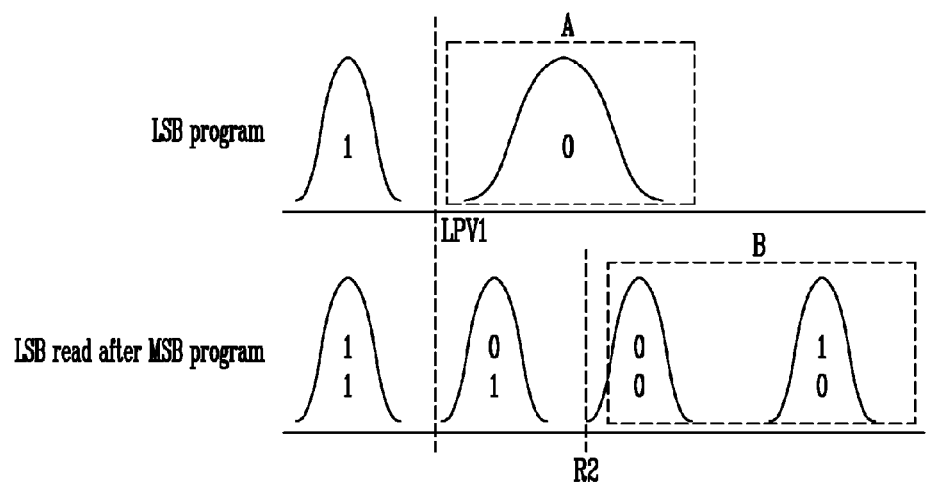
Figure 12:
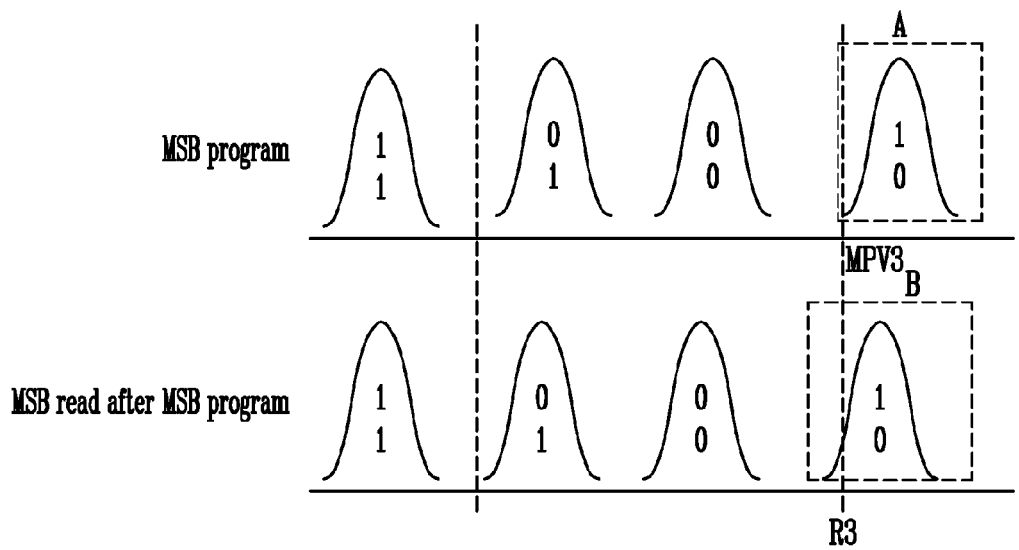

FIGS. 10 to 12 are diagrams illustrating the moving read mode illustrated in FIG. 9.

Referring to FIG. 10, when the moving read mode is selected in the embodiment of the present invention, the memory cells in region A, that is, the memory cells in the third state ("00") and the memory cells in the fourth state ("01") among the two bits multi-level cells, are used as reference cells for changing the second read voltage. Further, the memory cells in region B, that is, the memory cells in the fourth state ("01") among the two bits multi-level cells, are used as reference cells for changing the third read voltage. Each of the second read voltage and the third read voltage may be changed by using the reference cells dedicated to the second read voltage and the third read voltage. Accordingly, both the LSB page and the MSB page may achieve an effect by the moving read. FIG. 10 also illustrates first to third program verification voltages PV1, PV2, and PV3 as well as first state ("11") and second state ("10").

Referring to FIG. 11, in order to calculate an offset read voltage for the second read voltage in the moving read mode, the number of memory cells A having a threshold voltage equal to or larger than the program verification voltage LPV1 in the LSB program operation is counted. After the MSB program operation is performed, the number of memory cells having a threshold voltage equal to or larger than the second read voltage R2, that is, the memory cells B in the third state ("00") and the fourth state ("01") is counted by performing the read operation based on the default second read voltage R2. The offset read voltage for the second read voltage R2 is calculated according to a difference of the counted numbers. Accordingly, it is possible to achieve the effect by the moving read of the LSB page. FIG. 11 also illustrates bits 1 and 0 and a first state ("11") and a second state ("10").

Referring to FIG. 12, in order to calculate an offset read voltage for the third read voltage in the moving read mode, the number of memory cells A having a threshold voltage equal to or larger than the third program verification voltage MPV3 in the MSB program operation is counted. After the MSB program operation is performed, the number of memory cells having a threshold voltage equal to or larger than the third read voltage R3, that is, the memory cells B in the fourth state ("01") is counted by performing the read operation based on the default third read voltage R3. The offset read voltage for the third read voltage R3 is calculated according to a difference of the counted numbers. Accordingly, it is possible to achieve the effect by the moving read of the MSB page. FIG. 12 also illustrates memory cells B and first through third states ("11" "01" "00").

Figure 13:
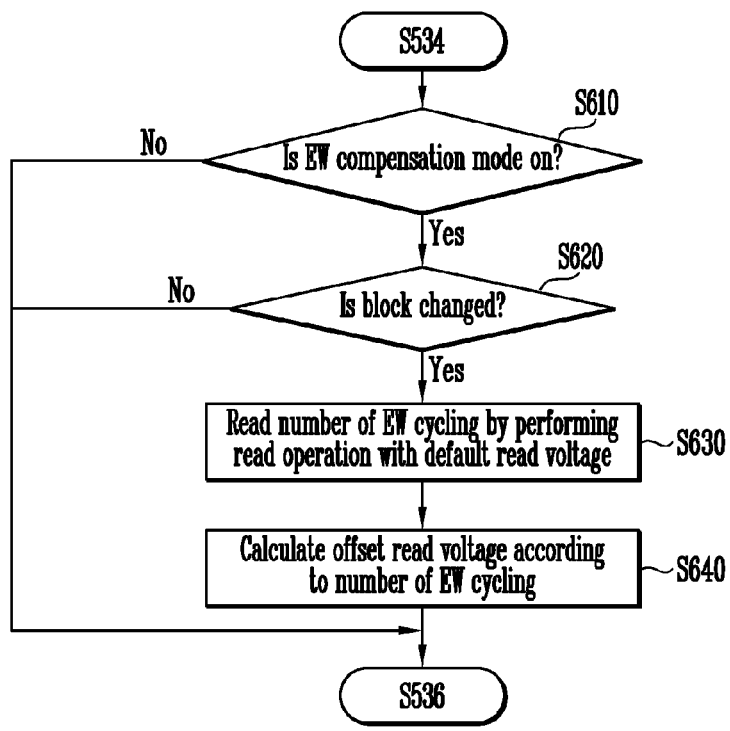
FIG. 13 is a flowchart illustrating a program/erase compensation mode in the read operation of FIG. 9.

FIG. 13 is a flowchart illustrating the program/erase compensation mode in the read operation of FIG. 9.

After the offset read voltages for the second read voltage and the third read voltage are calculated in step S534 of FIG. 7, the sizes of the second read voltage and the third read voltage may be additionally changed by the program/erase compensation mode.

Referring to FIG. 13, whether the program/erase compensation mode is selected is identified (S610) (i.e., is EW compensation mode on?). When the program/erase compensation mode is selected, whether a memory block performing the operation is changed is identified (S620).

When the memory block is changed, the number of program/erase cycling is read by performing the read operation on the flag cells with the default read voltage (S630) (i.e., read number of EW cycling by performing read operation with default read voltage). The change of the memory block may be detected through the generation of the signal by the control circuit.

Next, offset read voltages for the second read voltage and the third read voltages are calculated according to the number of program/erase cycling (S640) (i.e., calculate offset read voltage according to number of EW cycling), and then the process proceeds to step S536.

The same offset value is applied within the same block. That is, when a different page is read within the same block, the read operation for reading the number of program/erase cycling is not performed. In this case, the offset value may be stored in a register and the like.

In a case of multi planes, it may be controlled so that a plane having the larger or smaller number of program/erase cycling is selected by comparing the numbers of program/erase cycling of both planes.

Accordingly, when the moving read mode and the program/erase compensation mode are selected, the second read voltage and the third read voltage may be accurately changed. When all of the moving read mode, the program/erase compensation mode, and the randomize mode are selected, a time for the operation may be reduced while accurately changing the second read voltage and the third read voltage.

Figure 14:
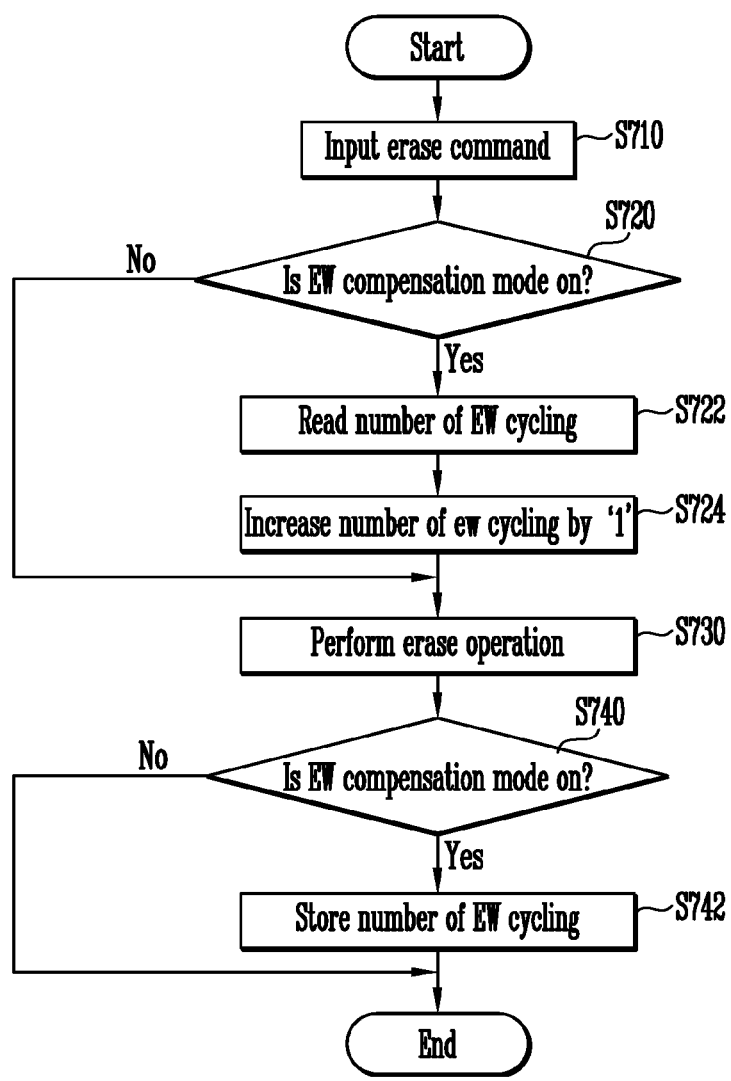
FIG. 14 is a flowchart illustrating an erase operation among the operations of the semiconductor memory device according to the embodiments of the present invention.

FIG. 14 is a flowchart illustrating the erase operation among the operations of the semiconductor memory device according to the embodiments of the present invention.

The erase operation is related to the program/erase compensation mode.

Referring to FIG. 14, an erase command is first input (S710). Whether the program/erase compensation mode is selected is identified (S720) (i.e., Is EW compensation mode on?). When the program/erase compensation mode is selected, the read operation is performed on the flag cells with the default read voltage and the number of program/erase cycling is read (S722) (i.e., Read number of EW cycling).

Next, the number of program/erase cycling is increased by "1" (S724) (i.e., Increase number of ew cycling by '1'), and the erase operation is performed (S730).

When the program/erase compensation mode is selected (S740) (i.e., Is EW compensation mode on?), the number of program/erase cycling is stored in the flag cell (S742) (i.e., Store number of EW cycling).

When the program/erase compensation mode is not selected, the process proceeds from step S720 to step S730 and the operation is completed in step S740.

Figure 15:
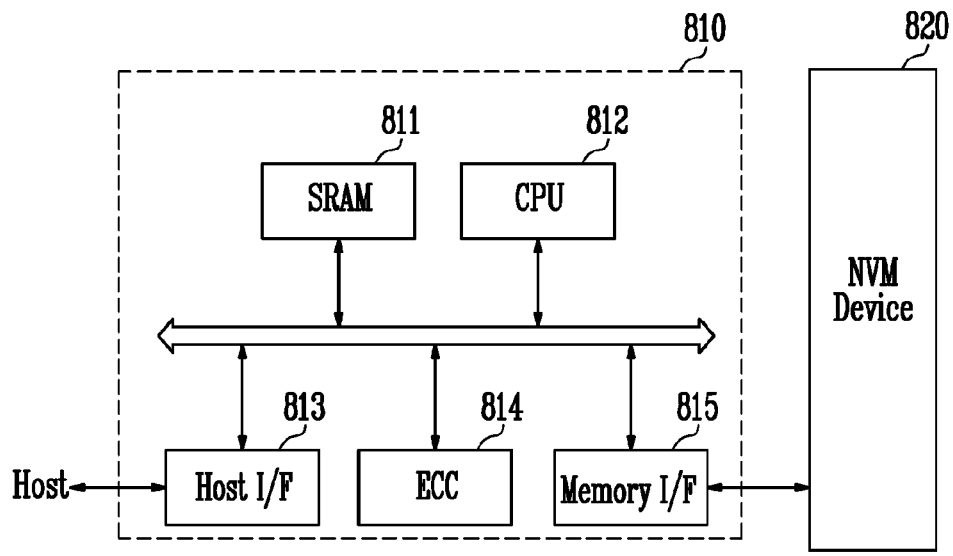
FIG. 15 is a block diagram schematically illustrating a memory system according to an embodiment of the present invention.

FIG. 15 is a block diagram schematically illustrating a memory system according to an embodiment of the present invention.

Referring to FIG. 15, a memory system 800 according to an embodiment of the present invention may include a non-volatile memory device 820 and a memory controller 810.

The non-volatile memory device 820 may include the aforementioned semiconductor memory device for compatibility with the memory controller 810, and may be operated by the aforementioned method. The memory controller 810 may be configured so as to control the non-volatile memory device 820. A memory card or a semiconductor disk device (Solid State Disk: SSD) may be provided through a combination of the non-volatile memory device 820 and the memory controller 810. An SPAM 811 is used as an operation memory of a processing unit 812. A host interface 813 may include a data exchange protocol of a host connected with the memory system 800. An error correction block 814 detects and corrects an error included in data read from the non-volatile memory device 820. A memory interface 814 interfaces with the non-volatile memory device 820 of the present invention. The processing unit 812 performs a general control operation for data exchange of the memory controller 810.

Although it is not illustrated in the drawing, it is apparent to those skilled in the art that a ROM (not shown) for storing code data for interfacing with the host may be further included in the memory system 800 according to the present invention. The non-volatile memory device 820 may be provided as a multi-chip package including a plurality of flash memory chips. The aforementioned memory system 800 of the present invention may be provided as a storage medium with high reliability with a low error generation probability. Especially, the flash memory device of the present invention may be included in a memory system, such as a semiconductor disk device (Solid State Disk (SSD)), which has been recently actively researched. In this case, the memory controller 810 may be configured so as to communicate with an external device (for example, a host) through one among various interface protocols, such as USB, MMC, PCI-E, SATA, PATA, SCSI, ESDI, and IDE.

Figure 16:
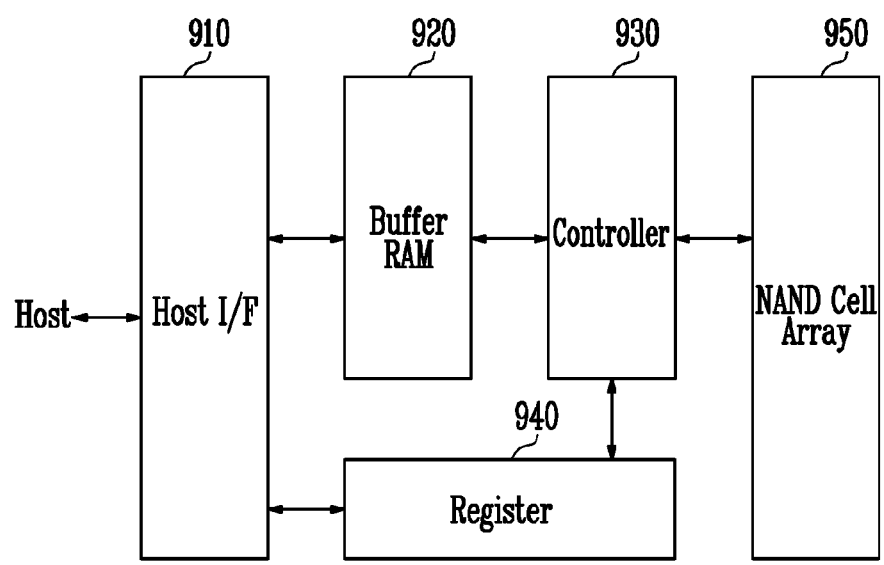
FIG. 16 is a block diagram schematically illustrating a fusion memory device or a fusion memory system performing the program operation according to the aforementioned various embodiments.

FIG. 16 is a block diagram schematically illustrating a fusion memory device or a fusion memory system performing the program operation according to the aforementioned various embodiments. For example, the technical characteristic of the present invention may be applied to a One NAND flash memory device 900 as a fusion memory device.

The One NAND flash memory device 900 may include a host interface 910 for exchanging various information with a device using a different protocol, a buffer RAM 920 including a code for driving the memory device therein or temporarily storing data, a controller 930 for controlling reading, a program, and all states in response to a control signal and a command provided from the outside, a register 940 for storing a command, an address, and data, such as configuration, for defining a system operation environment inside the memory device, and a NAND flash cell array 950 including an operation circuit including a non-volatile memory cell and a page buffer. The One NAND flash memory device programs the data by the aforementioned method in response to a request for wiring from the host.

Figure 17:
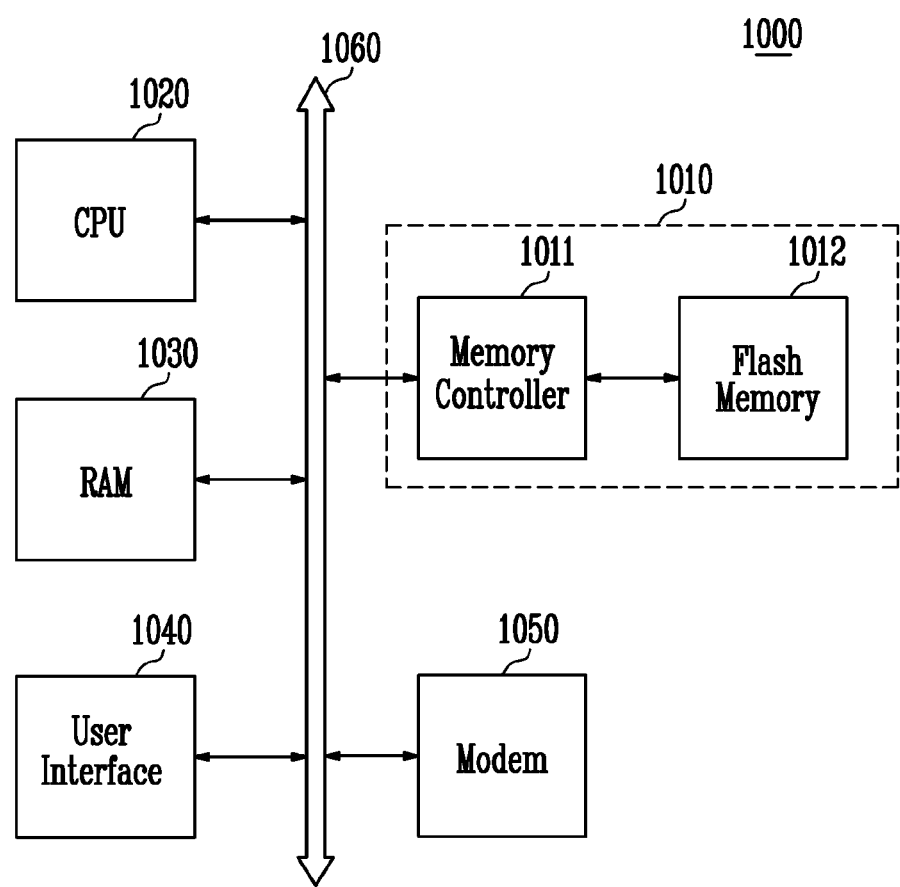
FIG. 17 is a block diagram schematically illustrating a computing system including a flash memory device according to an embodiment of the present invention.

FIG. 17 is a block diagram schematically illustrating a computing system including a flash memory device 1012 according to the present invention.

A computing system 1000 according to the present invention may include a microprocessor 1020 electrically connected to a system bus 1060, a RAM 1030, a user interface 1040, a modem 1050, such as a baseband chipset, and a memory system 1010. When the computing system 1000 according to the present invention is a mobile device, a battery (not shown) for supplying an operation voltage of the computing system 1000 may be additionally provided. Although it is not illustrated in the drawing, it is apparent to those skilled in the art that the computing system 1000 according to the present invention may further include an application chipset, a Camera Image Processor (CIS), a mobile DRAM, and the like. The memory system 1010 may include, for example, a Solid State Drive/Disk (SSD) using a non-volatile memory for storing data. Otherwise, the memory system 1010 may be provided as a fusion flash memory (for example, a One NAND flash memory).

The aforementioned embodiment of the present invention is not implemented through an apparatus and a method, but may be implemented through a program for performing a function corresponding to the configuration of the embodiment of the present invention or a recording medium in which the program is recorded, and the implementation may be easily achieved from the description of the aforementioned embodiment by those skilled in the art.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A method of operating a semiconductor memory device comprising:
   determining whether most significant bit (MSB) data is programmed on a selected page;
   determining whether a moving read mode is selected when the MSB data is programmed;
   performing a first read operation on the selected page using a default read voltage when the MSB data is not programmed or the moving read mode is not selected;
   determining whether a randomize mode is selected when the first read operation is performed;
   counting the number of first reference cells in which least significant bit (LSB) data is programmed on the selected page by an LSB program operation when the moving read mode is selected;
   counting the number of second reference cells in which the MSB data is programmed by an MSB program operation among the first reference cells;
   counting the number of first comparison cells in which the LSB data is programmed by performing an LSB read operation based on a second read voltage among first to third read voltages;
   counting the number of second comparison cells in which the MSB data is programmed by performing an MSB read operation based on the third read voltage;
   changing the second read voltage according to a difference between the number of first reference cells and the number of first comparison cells;
   changing the third read voltage according to a difference between the number of second reference cells and the number of second comparison cells; and
   performing a second read operation on the selected page using the changed second read voltage and the changed third read voltage.

2. The method of claim 1, wherein the randomize mode when the randomize mode is selected comprises:
   randomizing input data to first to fourth data;
   programming randomized data;
   counting the number of first cells in which the third or fourth data is programmed by performing a read operation based on a second read voltage among the first to third read voltages;
   counting the number of second cells in which the fourth data is programmed by performing the read operation based on the third read voltage;
   changing the second read voltage according to a difference between the number of third or fourth data among the randomized data and the number of first cells; and
   changing the third read voltage according to a difference between the number of fourth data among the randomized data and the number of second cells.

3. The method of claim 1, wherein read data read by the first read operation is output.

4. The method of claim 1, further comprising re-changing the second read voltage and the third read voltage according to the number of program/erase cycling when the second read voltage and the third read voltage are changed.

5. A semiconductor memory device, comprising:
   a memory array comprising memory cells;
   a page buffer group configured to program data in the memory cells or read data from the memory cells;
   a voltage supply circuit configured to supply an operation voltage to the memory array;
   a random value generation circuit configured to output a random value for randomizing input data to the page buffer group; and
   a control circuit configured to control the page buffer group and the random value generation circuit in response to a command signal, and control the voltage supply circuit so as to determine whether most significant bit (MSB) data is programmed on a selected page, determine whether a moving read mode is selected when the MSB data is programmed, perform a first read operation on the selected page using a default read voltage when the MSB data is not programmed or the moving read mode is not selected, determine whether a randomize mode is selected when the first read operation is performed, count the number of first reference cells in which least significant bit (LSB) data is programmed on the selected page by an LSB program operation when the moving read mode is selected, count the number of second reference cells in which the MSB data is programmed by an MSB program operation among the first reference cells, count the number of first comparison cells in which the LSB data is programmed by performing an LSB read operation based on a second read voltage among first to third read voltages, count the number of second comparison cells in which the MSB data is programmed by performing an MSB read operation based on the third read voltage, change the second read voltage according to a difference between the number of first reference cells and the number of first comparison cells, change the third read voltage according to a difference between the number of second reference cells and the number of second comparison cells, and perform a second read operation on the selected page using the changed second read voltage and the changed third read voltage.

6. The semiconductor memory device of claim 5, wherein the control circuit comprises:
   a mode selection unit configured to output a first selection signal for selecting the moving read mode, a second selection signal for selecting a randomize mode, and a third selection signal for selecting a program/erase compensation mode in response to the command signal;
   an element control unit configured to output a first control signal for controlling the page buffer group in response to the first to third selection signals and a second control signal for controlling the random value generation circuit in response to the second selection signal; and
   a read voltage estimation unit configured to change the second and third read voltages according to the differences or output a third control signal for changing the second and third read voltages according to the number of program/erase cycling to a voltage generation circuit.

7. The semiconductor memory device of claim 6, wherein the read voltage estimation unit is configured to output the third control signal for changing the second read voltage according to the difference between the number of first reference cells and the number of first comparison cells and changing the third read voltage according to the difference between the number of second reference cells and the number of second comparison cells.

8. The semiconductor memory device of claim 7, wherein the read voltage estimation unit is configured to output the third control signal for changing the second read voltage and the third read voltage according to the number of program/erase cycling.

9. The semiconductor memory device of claim 6, wherein the read voltage estimation unit comprises:
   a DSV generation unit configured to calculate a difference value according to the differences; and
   a read voltage control unit configured to output the third control signal according to the difference value.

10. A method of operating a semiconductor memory device comprising:
    determining whether most significant bit (MSB) data is programmed on a selected page;
    determining whether a moving read mode is selected when the MSB data is programmed;
    performing a first read operation on the selected page using a default read voltage when the MSB data is not programmed or the moving read mode is not selected;
    counting the number of first reference cells in which least significant bit (LSB) data is programmed on the selected page by an LSB program operation when the moving read mode is selected;
    counting the number of second reference cells in which the MSB data is programmed by an MSB program operation among the first reference cells;
    counting the number of first comparison cells in which the LSB data is programmed by performing an LSB read operation based on a second read voltage among first to third read voltages;
    counting the number of second comparison cells in which the MSB data is programmed by performing an MSB read operation based on the third read voltage;
    changing the second read voltage according to a difference between the number of first reference cells and the number of first comparison cells;
    changing the third read voltage according to a difference between the number of second reference cells and the number of second comparison cells;
    performing a second read operation on the selected page using the changed second read voltage and the changed third read voltage; and
    determining whether a randomize mode is selected when the second read operation is performed.

11. The method of claim 10, wherein the randomize mode when the randomize mode is selected comprises:
    randomizing input data to first to fourth data;
    programming the randomized data;
    counting the number of first cells in which the third or fourth data is programmed by performing a read operation based on a second read voltage among first to third read voltages;
    counting the number of second cells in which the fourth data is programmed by performing the read operation based on the third read voltage;
    changing the second read voltage according to a difference between the number of third or fourth data among the randomized data and the number of first cells; and
    changing the third read voltage according to a difference between the number of fourth data among the randomized data and the number of second cells.

12. The method of claim 10, wherein read data read by the first read operation is output.

13. A semiconductor memory device, comprising:
    a memory array comprising memory cells;
    a page buffer group configured to program data in the memory cells or read data from the memory cells;
    a voltage supply circuit configured to supply an operation voltage to the memory array;
    a random value generation circuit configured to output a random value for randomizing input data to the page buffer group; and
    a control circuit configured to control the page buffer group and the random value generation circuit in response to a command signal, and control the voltage supply circuit so as to determine whether most significant bit (MSB) data is programmed on a selected page, determine whether a moving read mode is selected when the MSB data is programmed, perform a first read operation on the selected page using a default read voltage when the MSB data is not programmed or the moving read mode is not selected, count the number of first reference cells in which least significant bit (LSB) data is programmed on the selected page by an LSB program operation when the moving read mode is selected, count the number of second reference cells in which the MSB data is programmed by an MSB program operation among the first reference cells, count the number of first comparison cells in which the LSB data is programmed by performing an LSB read operation based on a second read voltage among first to third read voltages, count the number of second comparison cells in which the MSB data is programmed by performing an MSB read operation based on the third read voltage, change the second read voltage according to a difference between the number of first reference cells and the number of first comparison cells, change the third read voltage according to a difference between the number of second reference cells and the number of second comparison cells, perform a second read operation on the selected page using the changed second read voltage and the changed third read voltage, and determine whether a randomize mode is selected when the second read operation is performed.

\* \* \* \* \*